United States Patent [19]
Ko et al.

[11] Patent Number: 6,121,825
[45] Date of Patent: Sep. 19, 2000

[54] MONOLITHIC TUNABLE RECURSIVE FILTER

[75] Inventors: Jin-Su Ko, Suwon; Kwyro Lee, Taejeon, both of Rep. of Korea

[73] Assignee: Samsung Electronics Co., LTD, Rep. of Korea

[21] Appl. No.: 09/092,357

[22] Filed: Jun. 5, 1998

[30] Foreign Application Priority Data

Dec. 8, 1997 [KR]  Rep. of Korea ...................... 97-66765

[51] Int. Cl.$^7$ .................................................. H03K 5/00
[52] U.S. Cl. ...................... 327/553; 327/552; 708/319; 333/166; 330/109; 330/305
[58] Field of Search ..................... 327/552, 553, 327/562; 330/305, 107, 109; 708/319; 333/166, 202

[56] References Cited

U.S. PATENT DOCUMENTS

| | | | |
|---|---|---|---|
| 5,032,839 | 7/1991 | Even-Or | 327/553 |
| 5,339,057 | 8/1994 | Rauscher | 333/166 |
| 5,661,437 | 8/1997 | Nishikawa et al. | 330/282 |

OTHER PUBLICATIONS

Jin–Su Ko, Kwyro Lee, "Low Power, Monolithic Tunable Recursive Filters having Variable and Uniform Gain," 1997 IEEE Radio Frequency Integrated Circuits Symposium, pp. 51–54.

Schellenberg, James, Digest of Technical Papers, 1997 IEEE Radio Frequency Integrated Circuits (RFIC) Symposium, Denver, Colorado, Jun., 1997.

Delmond, M., et al. "Microwave Tunable Active Filter Design in MMIC Technology Using Recursive Concepts," IEEE 1995 Microwave and Millimeter–Wave Monolithic Circuits Symposium, pp. 105–108, Jul. 1995.

Kobayashi, K.W., et al., "GaAs HBT 0.75–5 Ghz Multi-functional Microwave–Analog Variable Gain Amplifier," IEEE GaAs IC Symposium, pp. 239–242, Mar. 1993.

*Primary Examiner*—Dinh T. Le
*Attorney, Agent, or Firm*—Samuels, Gauthier & Stevens, LLP

[57] ABSTRACT

In a tunable recursive filter implemented in a microwave monolithic integrated circuit (MMIC), a second-order recursive filter included two first order filters, having first and second transmission lines, respectively, connected in parallel. An amplifying unit having a cascode amplifier is arranged in a forward path shared by the two first-order filters. A combiner receives an input signal and a first and second feedback signals fed back through the first and second transmission lines, respectively, and combines such signals to output a combined signal. The amplifying unit amplifies the combined signal and outputs an amplified signal. A divider divides the amplified signal from the amplifying unit, outputs a first portion of the divided signal, and feeds back a second and third portion of the divided signal through the first and second transmission lines.

20 Claims, 11 Drawing Sheets

FIG. 4

| | THE CASE OF FIG. 1 WHERE AMPLIFIER IS IN REVERSE PATH | THE CASE OF FIG. 3 WHERE AMPLIFIER IS IN FORWARD PATH |
|---|---|---|
| 1st-ORDER FILTER | $$\dfrac{\tfrac{1}{2} e^{-j\omega(2\tau_{cd}+\tau_r)}}{1-\dfrac{|S_{21r}|}{2} e^{-j\omega\tau}}$$ | $$\dfrac{\dfrac{|S_{21f}|}{2} e^{-j\omega(2\tau_{cd}+\tau_f)}}{1-\dfrac{|S_{21f}|}{2} e^{-j\omega\tau}}$$ |
| 2nd-ORDER FILTER | $$\dfrac{\left(\tfrac{1}{2} e^{-j\omega(2\tau_{cd}+\tau_r)}\right)^2}{1-2\dfrac{|S_{21r}|}{2} e^{-j\omega\tau}+\left(\dfrac{|S_{21r}|}{2} e^{-j\omega\tau}\right)^2}$$ | $$\dfrac{\dfrac{|S_{21f}|}{3} e^{-j\omega(2\tau_{cd}+\tau_f)}}{1-\dfrac{2|S_{21f}|}{3} e^{-j\omega\tau}}$$ |

MONOLITHIC TUNABLE RECURSIVE FILTER

BACKGROUND OF THE INVENTION

1. Field of the Invention

The present invention relates to a microwave filter, and more particularly, to a tunable recursive filter employed in a microwave monolithic integrated circuit (MMIC). This application is based on Korean Patent Application No. 97-66765, which is incorporated by reference herein for all purposes.

2. Description of Related Art

A microwave telecommunication system, e.g., cellular phone system, a global positioning system or a satellite broadcasting system, typically requires a small, low-power, high-frequency filter circuit with a high selectivity Q. Such a high-frequency filter circuit can be implemented by a passive circuit using passive components such as resistors, inductors and capacitors, as in a low-frequency filter. The passive filter may be implemented by using distributed circuit elements which are obtained by appropriately connecting a plurality of transmission lines, or by using discrete circuit elements.

When distributed circuit elements are used in the filter on a semiconductor integrated circuit (IC) chip, the transmission lines typically occupy a very large amount of chip area, which results in inefficient utilization of the chip area. Also, in the case of using discrete circuit elements, the resistors, inductors and capacitors used for the filter must be manufactured to have very small size. However, when the passive filter is implemented on a monolithic IC, it is difficult to accurately control resistance, inductance and capacitance in very small components on a semi-insulating substrate to very small, accurate circuit element values. Further, the passive filter has high signal transmission loss, and the passband edge thereof is not sharp, which results in a low selectivity Q.

In order to overcome the above problems of the passive filter, active filters are usually used in an MMIC. Such active filters can include a recursive filter and a transversal filter and a filter using an active inductor.

FIG. 1A shows the topology of a conventional first-order recursive filter 108. The filter 108 of FIG. 1A is described in an article entitled "Microwave tunable active filter design in MMIC technology using recursive filter," IEEE MMWMC Sym. Dig., pp. 105–108, 1995, by M.Delmond et al., which is incorporated herein in its entirety by reference. In the filter, one amplifier 110 is included in a reverse path to increase a signal-to-noise ratio (S/N). However, the filter of FIG. 1A has a drawback in that it has relatively low gain and low selectivity.

Accordingly, in order to increase the gain and selectivity of the filter, a filter in which two or more filters are connected in series has been suggested. FIG. 1B shows the topology of a second-order filter 116 in which two unit filters 112 and 114 are connected in series. The filter 116 of FIG. 1B is described in an article entitled "High-order monolithic active recursive filter based on multicellular approach," IEEE Int. Microwave Symp. Dig., pp. 623–626, 1996, by M. Delmond et al.

However, since the filter 116 of FIG. 1B includes a separate amplifier in each unit filter, it consumes a large amount of power and occupies a large amount of chip area. Also, the filter 116 uses a varactor diode for varying the passband of the filter. The impedance of the varactor changes according to a varactor control voltage, so the gain of the filter 116 varies according to a central frequency of the filter. FIGS. 2A and 2B illustrate such a phenomenon. Preferably, the gain of the filter must be constant even if the central frequency is changed, as shown in FIG. 2B. However, the gain of the filter of FIG. 1B decreases as the central frequency increases as shown in FIG. 2A.

SUMMARY OF THE INVENTION

To solve the above problems, an object the present invention is to provide a monolithic tunable recursive filter which consumes low power, and in which the gain is maintained at a predetermined level even if a central frequency and a passband are changed.

According to an aspect of the present invention, there is provided a first-order monolithic tunable recursive filter. The filter comprises a transmission line. A combiner receives an input signal and a feedback signal fed back through the transmission line and combines the input signal with the feedback signal to output a combined signal. An amplifying unit amplifies the combined signal and outputs an amplified signal. A divider divides the amplified signal from the amplifying unit, outputs one portion of the divided signal, and feeds back the other portion of the divided signal through the transmission line. The amplifying unit includes a variable gain type cascode amplifier and a varactor diode connected to the variable gain type cascode amplifier for providing a phase deviation to a frequency response of the variable gain type cascode amplifier.

In general, the gain control range of a cascode amplifier is wide, and the phase characteristic thereof is relatively constant with respect to the gain or input signal. Due to the constant phase characteristics of the cascode amplifier, the filter of the present invention can maintain a constant gain even if the central frequency is changed by the varactor diode. Also, in the present invention, an amplifier for increasing the total gain is located in a forward path of the filter.

According to another aspect of the invention, there is provided a second-order monolithic tunable recursive filter, which can be considered to include two first-order filters according to the invention in parallel. The filter comprises a first transmission line of a first length and a second transmission line of a second length. A combiner receives an input signal, a first feedback signal fed back through the first transmission line, and a second feedback signal fed back through the second transmission line, and combines the input signal and the first and second feedback signals to output a combined signal. An amplifying unit amplifies the combined signal and outputs an amplified signal. A divider divides the amplified signal from the amplifying unit, outputs a first portion of the divided signal, and feeds back a second and third portion of the divided signal through the first and second transmission lines, respectively.

In one embodiment, the first transmission line has approximately the same length as the second transmission line. However, by making the lengths of the first and second transmission lines different, the second-order monolithic recursive filter may be used as a tuned amplifier, in accordance with the invention.

Since the recursive filter of the present invention uses a cascode amplifier, a constant gain can be obtained regardless of the central frequency because an increase or decrease of the gain may be re-adjusted when the gain is increased or decreased according to the change of the central frequency. In particular, according to the second-order recursive filter of the present invention, the intended gain can be obtained using less power since unit filters are connected in parallel and just a single amplifier is arranged in a forward path.

BRIEF DESCRIPTION OF THE DRAWINGS

The above objects and advantages of the present invention will become more apparent from the following detailed description of preferred embodiments thereof with reference to the attached drawings in which:

FIG. 4 shows transfer characteristics of the amplifiers shown in FIGS. 1A, 1B, 3A and 3B;

DESCRIPTION OF THE PREFERRED EMBODIMENTS

Figure 1A:
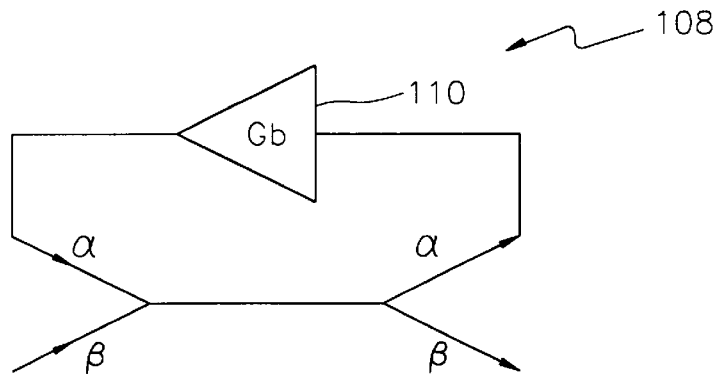
FIGS. 1A and 1B show topologies of conventional first and second order recursive filters, respectively.
Figure 1B:
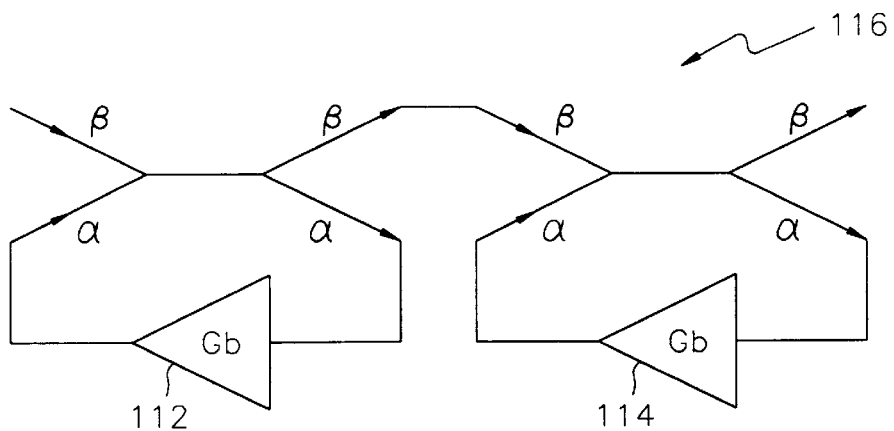
Figure 2A:
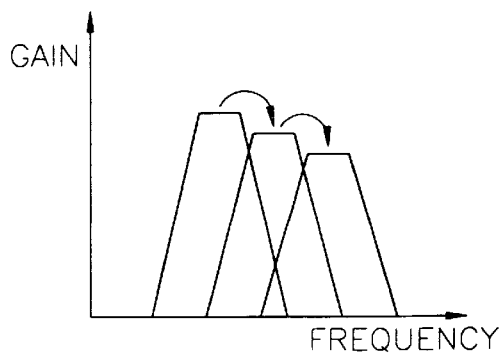
FIG. 2A illustrates the change in gain of the filter of FIG. 1B with respect to the central frequency of the filter.
Figure 2B:
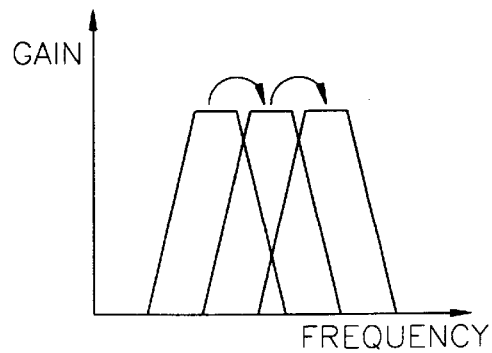
FIG. 2B illustrates an ideal change in a gain of a filter with respect to the central frequency of the filter.
Figure 3A:
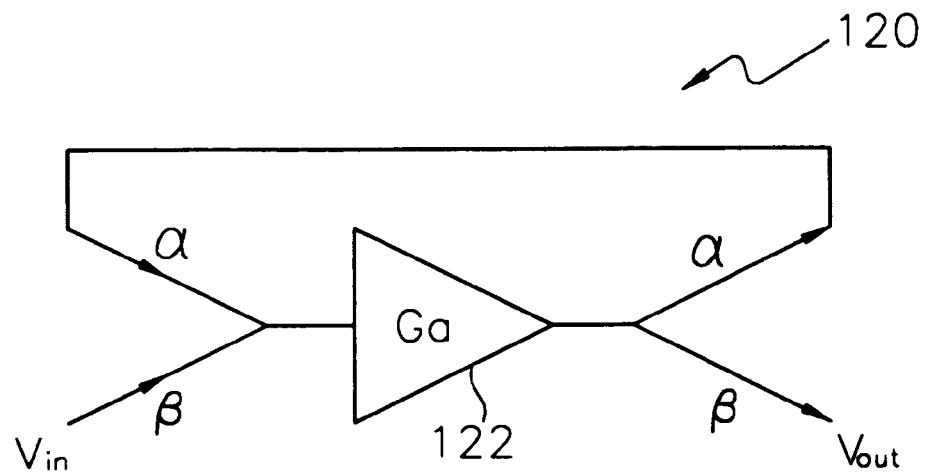
FIGS. 3A and 3B show topologies of first and second recursive filters, respectively, according to the present invention.
Figure 3B:
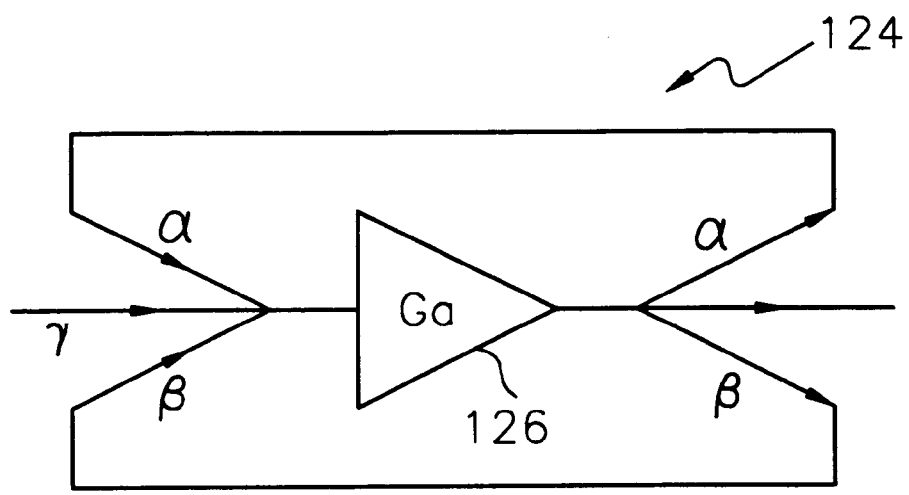

Referring to FIGS. 3A and 3B, first and second-order recursive filters of the present invention include an amplifier in a forward path. FIG. 3A shows a first-order filter 120 with an amplifier 122 in its forward path. FIG. 3B shows a second-order filter 124 with an amplifier 126 in its forward path. In FIGS. 3A and 3B, α, β and γ represent losses of a combiner and a divider (see FIG. 6).

FIG. 4 shows transfer characteristics of the amplifiers shown in FIGS. 1A, 1B, 3A and 3B. Each transfer function is obtained by Mason's gain formula, which is described in basic text books on control engineering and known to those skilled in the art. In FIG. 4, $\tau_{cd}$ represents the phase delay of the combiner and divider. In the case of the first-order filter, the gain of the filter of the present invention is increased to $S_{21}$ times the gain of a conventional filter because the amplifier is located in the forward path.

Figure 5:
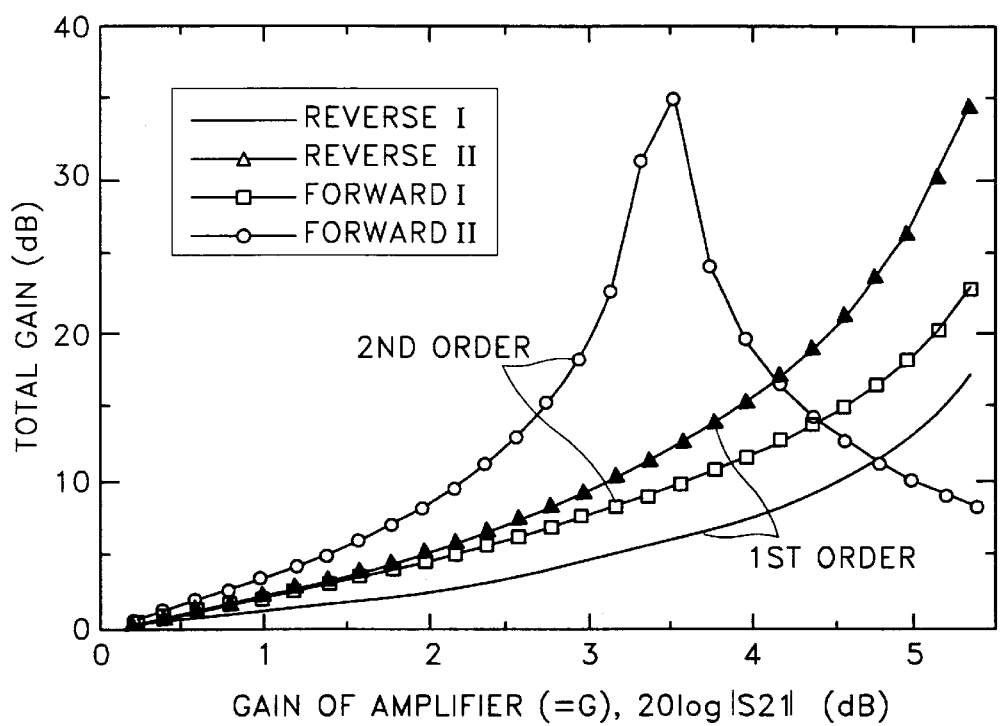
FIG. 5 is a graph showing the gain characteristics according to the transfer functions of FIG. 4.

FIG. 5 is a graph showing the gain characteristics according to the transfer functions of FIG. 4. As can be predicted from FIG. 4, both the first-order and second-order filters of the present invention have greater gain than the prior art filters of FIGS. 1A and 1B. Thus, at a given gain, an amplifier in accordance with the present invention consumes less power than a corresponding prior art filter art the same gain level.

Figure 6:
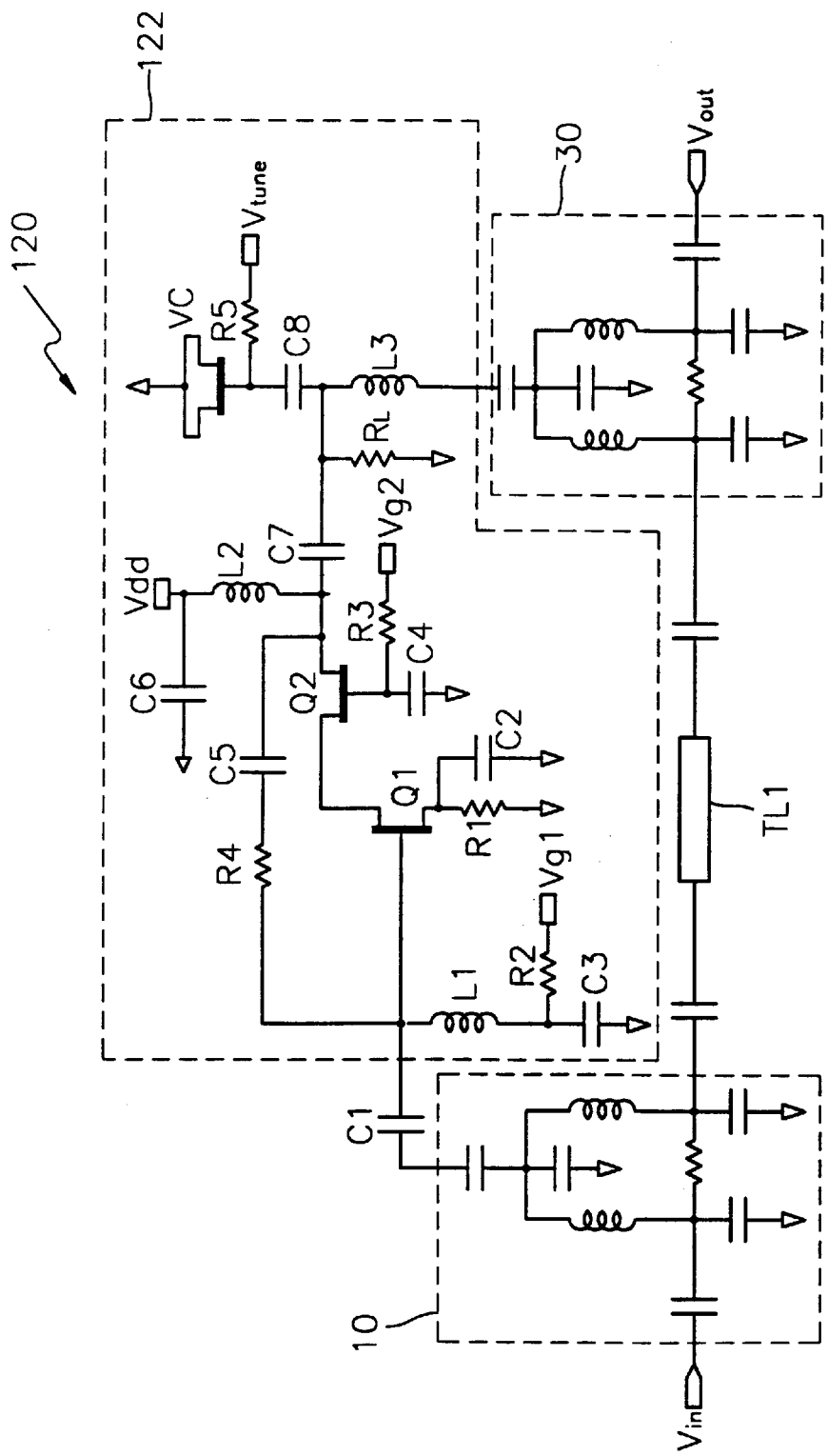
FIG. 6 is a circuit diagram of an embodiment of a first-order recursive filter according to the present invention.

FIG. 6 is a circuit diagram of an embodiment of a first-order recursive filter 120 according to the present invention. The first-order recursive filter of FIG. 1 includes a transmission line TL1, a combiner 10, an amplifying unit 122, and a divider 30.

The transmission line TL1 provides a path through which a portion of the signal output by the amplifying unit 122 is fed back to the combiner 10. The combiner 10 receives an input signal $V_{in}$ and the signal fed back through the transmission line TL1, and combines the input signal and the feedback signal to output a combined signal.

The amplifying unit 122 amplifies the signal output by the combiner 10 and outputs the amplified signal. In the present invention, the amplifying unit 122 includes a variable gain type cascode amplifier having transistors Q1 and Q2. In one embodiment, the transistors Q1 and Q2 are metal-semiconductor field effect transistors (MESFETs). Alternatively, transistors Q1 and Q2 can be metal-oxide-semiconductor field effect transistors (MOSFETs). The transistors are formed on a doped epitaxial layer on a semi-insulating compound semiconductor substrate. In one embodiment, the compound semiconductor can be gallium arsenide (GaAs). In another embodiment, it can be indium phosphide (InP).

The signal output by the combiner 10 is input to a gate of the transistor Q1 via a capacitor C1. The source of the transistor Q1 is grounded through a resistor R1 and a capacitor C2 which are connected in parallel. The resistor R1 stabilizes the bias of the transistor Q1, and the capacitor C2 provides an AC bypass path of the resistor R1.

Also, a gate bias voltage $V_{g1}$ is applied to the gate of the transistor Q1 via a resistor R2. Here, an inductor L1 for impedance matching may be added between the gate of the transistor Q1 and the resistor R2. A capacitor C3 prevents an AC component, caused by the variation of the gate bias voltage $V_{g1}$, from being input to the gate of the transistor Q1.

The source of the transistor Q2 is connected to a drain of the transistor Q1. Gate bias voltage $V_{g2}$ is applied to the gate of the transistor Q2 via a resistor R3. The capacitor C4 prevents an AC component, caused by the variation of the gate bias voltage $V_{g2}$, from being input to the gate of the transistor Q2. A resistor R4 provides a feedback path for stabilizing the circuit. A capacitor C5 is connected in series with the resistor R4 so that only the AC component is fed back.

A bias voltage Vdd is applied to a drain of the transistor Q2 via an RF choke inductor L2. The RF choke inductor L2 prevents the amplified RF signal from being output via a port to which the bias voltage $V_{dd}$ is applied, so that the amplified RF signal is routed to the divider 30. Also, the RF choke inductor L2 contributes to the impedance matching between the amplifying unit 122 and the divider 30. A capacitor C6 prevents an AC component, caused by the variation of the bias voltage $V_{dd}$, from being mixed with the amplified RF signal. A resistor $R_L$ connected to the drain of the transistor Q2 via a capacitor C7 acts as a load for the transistor Q2.

A varactor diode VC is coupled to a terminal of capacitor C7 opposite to the terminal of the capacitor C7 to which the transistor Q2 is connected. In one embodiment, the varactor diode VC is formed from a MESFET or MOSFET in which the source and drain are connected to each other as shown. The gate of a transistor used as the varactor diode VC receives a tuning voltage $V_{tune}$, and the capacitance of the varactor diode VC varies according to the tuning voltage $V_{tune}$. Such a change in capacitance provides phase deviation in the frequency response of the variable gain type cascode amplifier so that the central frequency and passband of the filter change. The source and the drain of the transistor are grounded. A capacitor C8 prevents the variation of the tuning voltage $V_{tune}$, from being mixed into the amplified RF signal.

An inductor L3 for impedance matching with the divider 30 is connected to the terminal of the capacitor C7 opposite to the terminal of the capacitor C7 to which the transistor Q2 is connected. The other end of the inductor L3 is connected to the divider 30. The divider 30 divides the amplified signal output by the amplifying unit 122 and outputs a portion of the divided signal as an output signal $V_{out}$ and feeds back the other portion via the transmission line TL1.

In another embodiment of the present invention, the source resistor R1 of the transistor Q1 and/or the parallel feedback resistor R4 may not be included. If the source resistor R1 of the transistor Q1 and the parallel feedback resistor R4 are not used, the gain of the cascode amplifier is increased.

Figure 7:
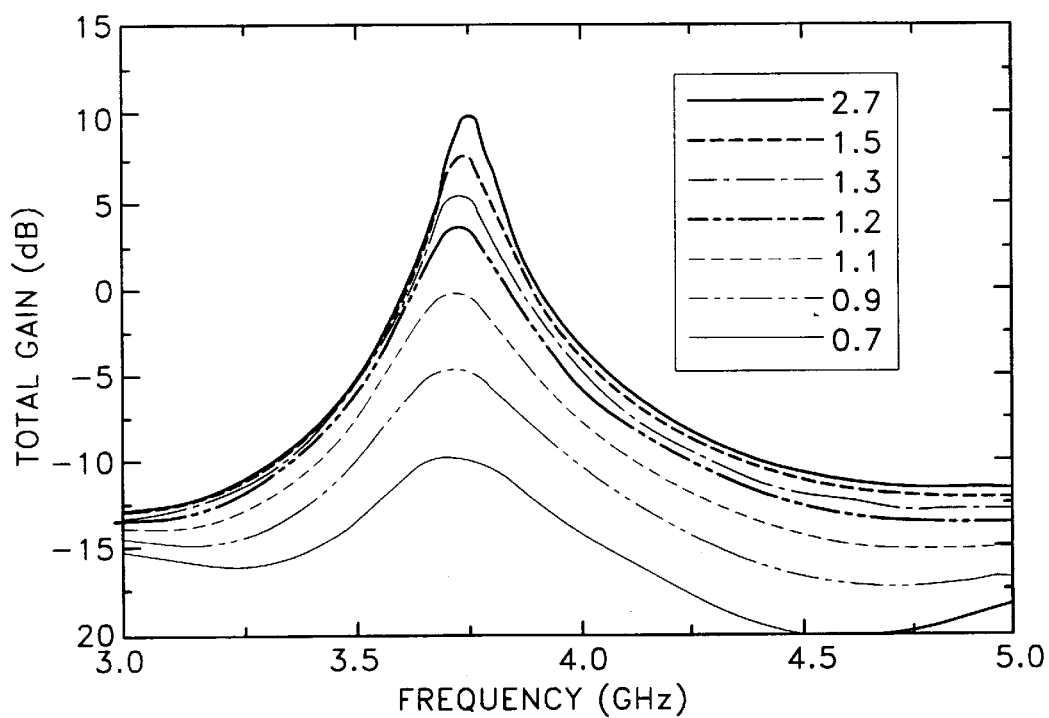
FIG. 7 is a graph showing change in gain and selectivity of the filter shown in FIG. 6, according to a gate bias.

FIG. 7 is a plot which illustrates change in gain and selectivity of the filter shown in FIG. 6 with changing gate voltage $V_{g2}$. As shown, in one embodiment, by changing the gate bias voltage $V_{g2}$ between 0.7V and 2.7V, the gain of the filter can be controlled between −9.7 dB and 10.0 dB, respectively. Here, the selectivity Q changes within the range of between 9.1 and 37.7, respectively. Also, as can be seen from FIG. 7, the central frequency is nearly constant as the gain changes, which illustrates the condition that the phase characteristics are constant regardless of the gain in the cascode amplifier.

Figure 8:
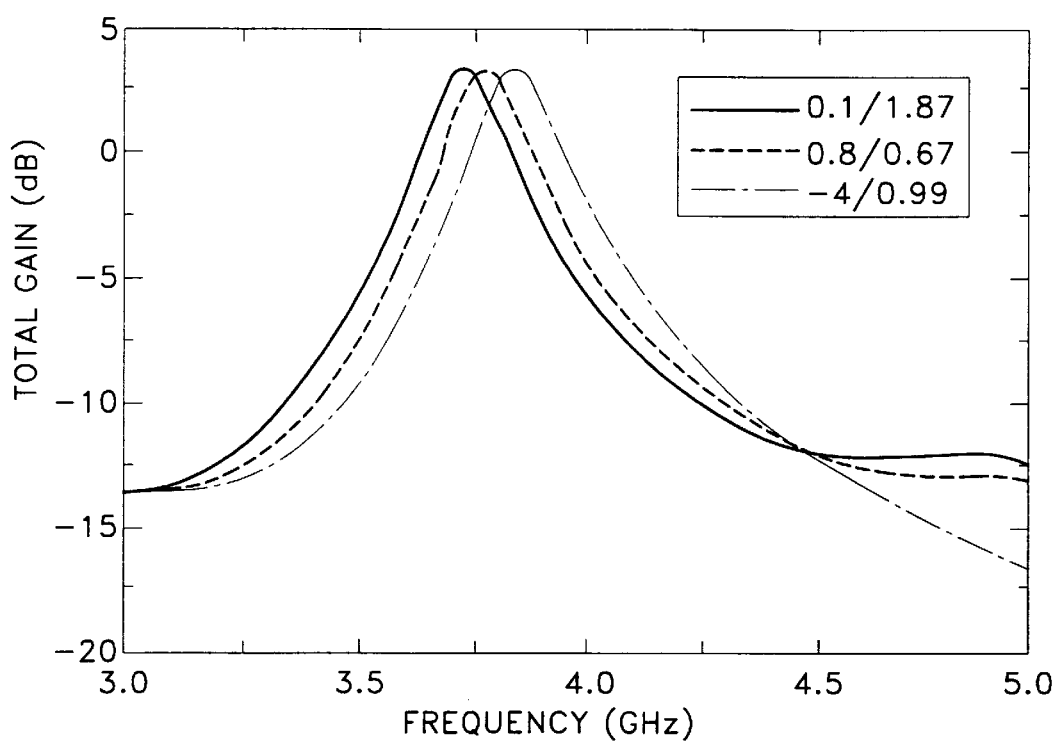
FIG. 8 is a graph showing frequency characteristics of the filter shown in FIG. 6.

FIG. 8 is a plot which illustrates frequency characteristics of the first-order filter shown in FIG. 6. As shown in FIG. 8, the central frequency fc can be shifted through the range between 3.74 GHz and 3.86 GHz by tuning the gate voltage $V_{tune}$ of the varactor. Here, the gain at the central frequency can be maintained at a predetermined level by controlling the gain of the cascode amplifier.

Figure 9:
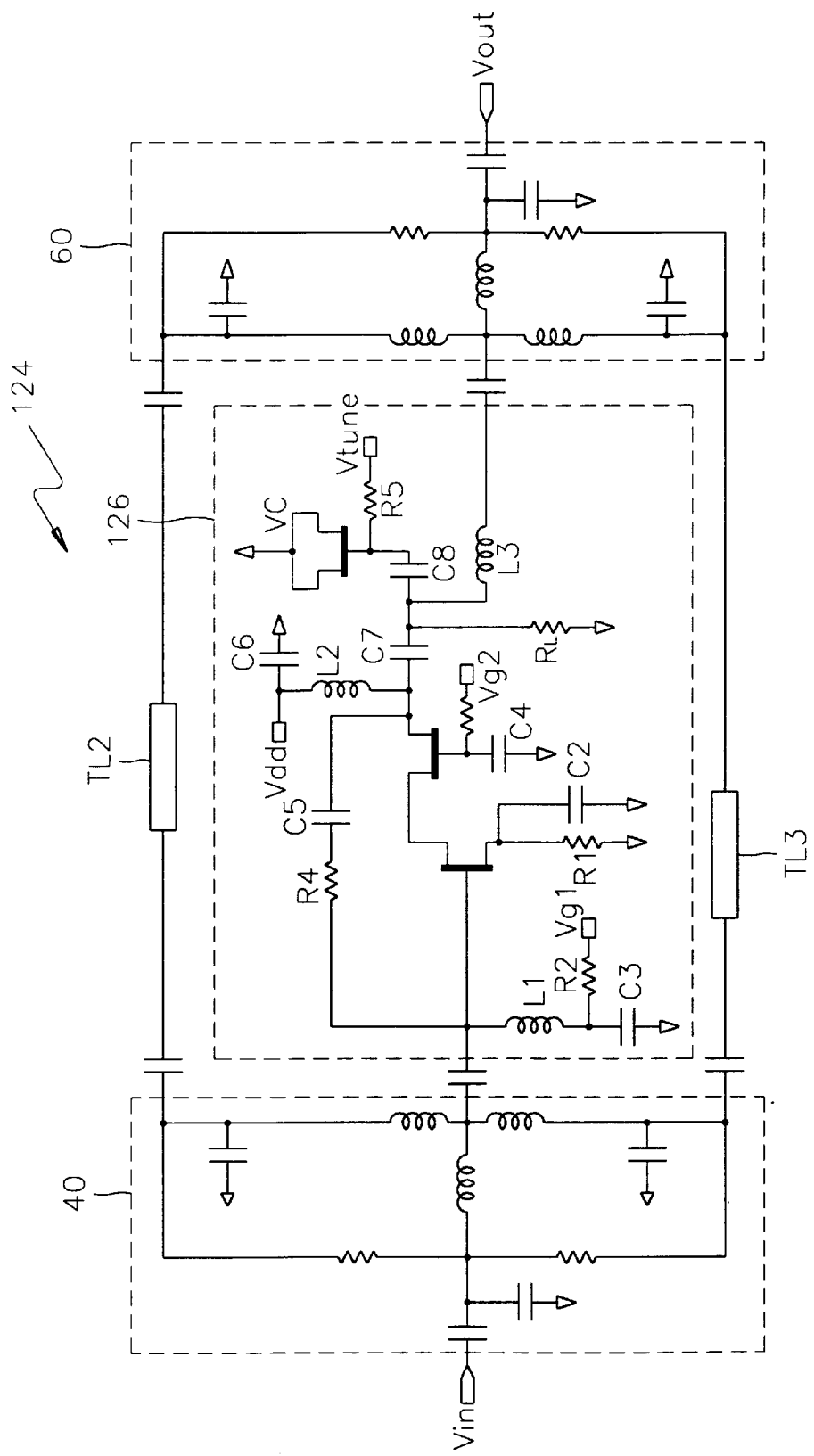
FIG. 9 is a circuit diagram of an embodiment of a second order recursive filter according to the present invention.

FIG. 9 is a circuit diagram of an embodiment of a second-order recursive filter according to the present invention. The second-order recursive filter includes two transmission lines TL2 and TFL3, a combiner 40, an amplifying unit 126, and a divider 60.

In the second-order recursive filter of FIG. 9, the divider 60 divides the amplified signal output by the amplifying unit 126 into three portions and outputs one of the divided portions as an output signal $V_{out}$ and feeds back the other two divided portions through the transmission lines TL2 and TL3. The combiner 40 receives an input signal $V_{in}$ and the signals fed back through the transmission lines TL2 and TL3 and combines the input signal $V_{in}$ with the feedback signals to output a combined signal. The amplifying unit 126 amplifies the combined signal output by the combiner 40 to output the amplified signal. In one embodiment, in the second-order recursive filter of FIG. 9, the structure of the amplifying unit 126 is the same as that of the first-order recursive filter of FIG. 6. Thus, the same reference numbers are designated to the same or similar elements, and description thereof will be omitted.

Figure 10:
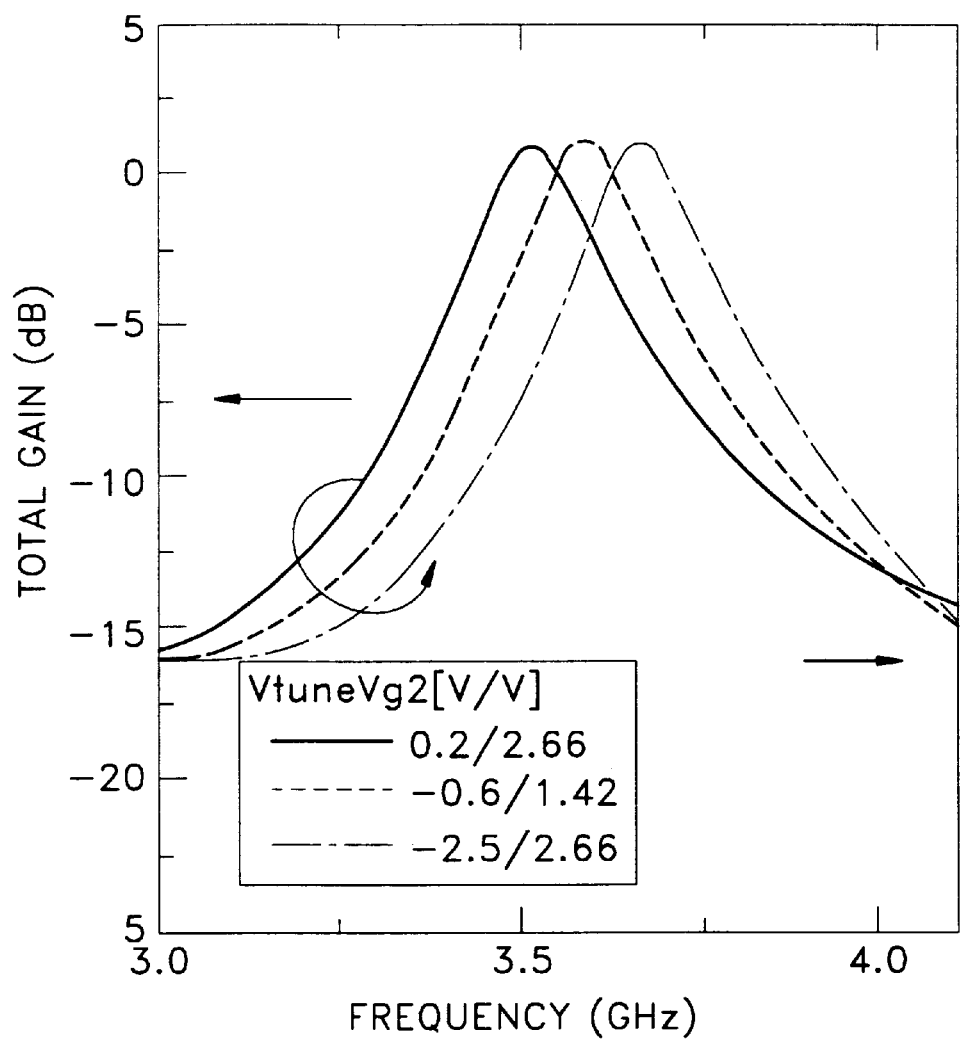
FIG. 10 is a graph showing frequency characteristics of the filter shown in FIG. 9.

FIG. 10 is a plot which illustrates the frequency characteristics of the second-order recursive filter of FIG. 9. As shown in FIG. 10, in one embodiment, the central frequency fc can be shifted through the range between 3.51 GHz and 3.66 GHz by tuning the gate voltage $V_{tune}$ of the varactor. As in the first-order filter, the gain at the central frequency can be maintained at a constant level by controlling the gain of the cascode amplifier.

Figure 11A:
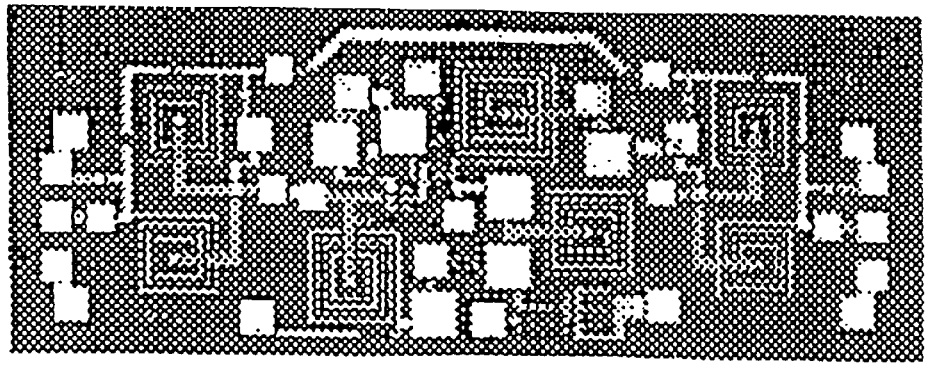
FIGS. 11A and 11B are enlarged photographs of fabricated monolithic ICs of the recursive filters according to the present invention.
Figure 11B:
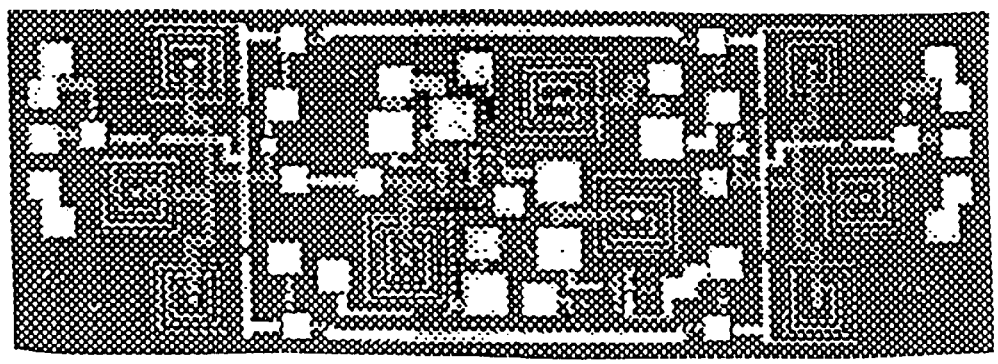

FIGS. 11A and 11B are enlarged photographs of monolithic ICs of the recursive filter according to the present invention. FIG. 11A shows the first-order recursive filter, and FIG. 11B shows the second-order recursive filter. In one embodiment, the monolithic ICs of FIGS. 11A and 11B are fabricated on a semi-insulating substrate made of gallium arsenic (GaAs). As shown in the photographs, only the spiral inductors, one plate of each capacitor, and interconnection patterns are exposed, while the transistors formed in the epitaxial layer of the semi-insulating GaAs substrate, the varactor, and resistors formed in a thin film are unexposed.

Figure 12:
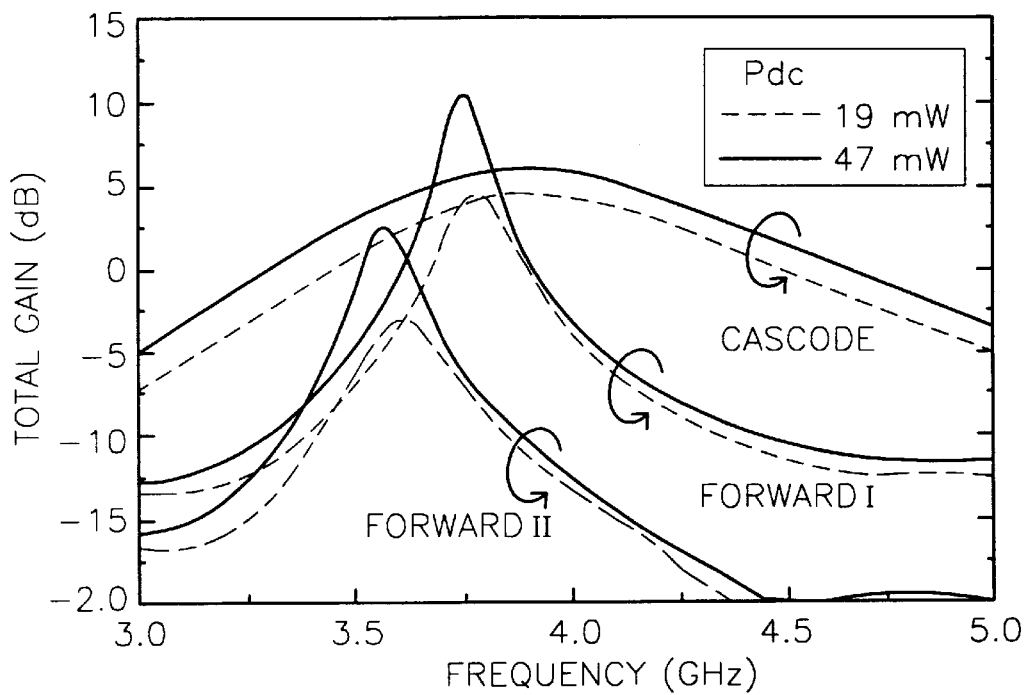
FIG. 12 is a graph comparatively showing the gain characteristics of the first and second-order recursive filters according to the present invention, and that of a cascode amplifier.

FIG. 12 is a plot which illustrates a comparison between the gain characteristics of the first- and second-order recursive filters and those of the cascode amplifier, at two bias conditions. In one of two conditions, the supply voltage $V_{dd}$ is 4.7V and a current $I_{ds}$ through the amplifier is 4.1 mA, in which case the power consumption is 19.2 mW. In the other condition, the supply voltage $V_{dd}$ is 5.5V and a current $I_{ds}$ through the amplifier is 8.5 mA, in which case the power consumption is 46.8 mW. Here, the measured gains of the recursive filters shown in FIG. 12 are lower than the predicted values shown in FIG. 5. This difference is due to the losses in the combiner and divider and the length of the transmission line placed in a reverse path.

In another embodiment, the circuit of FIG. 9 may be used as a tuned amplifier. When the circuit of FIG. 9 is used as the second-order recursive filter, it is preferable that the length of the transmission line TL2 is the same as that of the transmission line TL3. However, in case that the circuit of FIG. 9 is used as a tuned amplifier, it is preferable that the length of the transmission line TL2 is different from that of the transmission line TL3.

Figure 13:
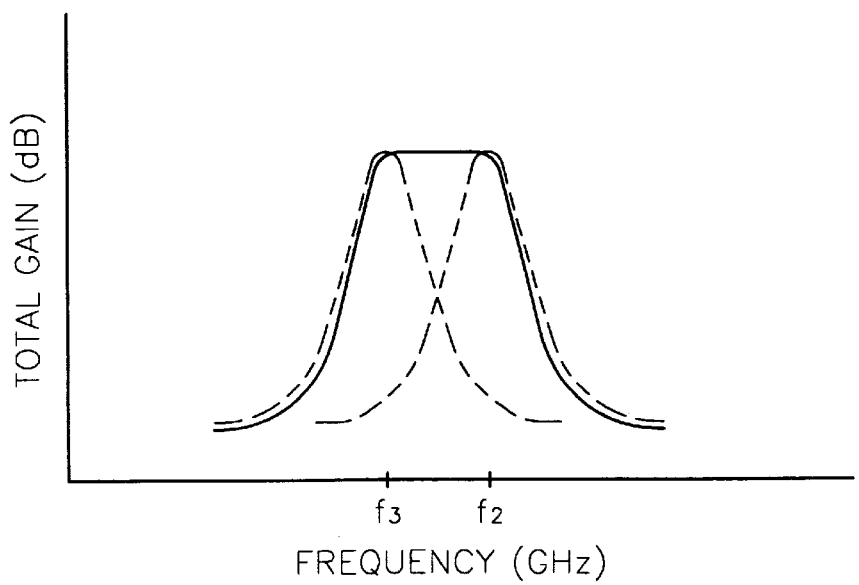
FIG. 13 is a graph showing gain characteristics of the circuit of FIG. 9 when the circuit is used as a tuned amplifier.

Assuming that the central frequency of the gain characteristics of a closed loop including the transmission line TL2 is $f_2$ and the central frequency of the gain characteristics of a closed loop including the transmission line TL3 is $f_3$, the gain characteristics of the tuned amplifier are shown in FIG. 13. As shown in the figure, the tuned amplifier can selectively amplify only signals having frequencies in the range between the frequencies $f_2$ and $f_3$. In general, the longer the transmission line length, the lower the central frequency. Thus, it was assumed in FIG. 13 that the transmission line TL2 is shorter than the transmission line TL3.

The present invention has been described in terms of preferred embodiments. However, it will be appreciated by those having ordinary skill in the art that various modifications can be made to the described embodiments without departing from the spirit and scope of the invention.

What is claimed is:

1. A monolithic tunable recursive filter comprising:
    a transmission line;
    a combiner for receiving an input signal and a feedback signal fed back through said transmission line and combining the input signal with the feedback signal to output a combined signal;
    an amplifying unit for amplifying the combined signal and outputting an amplified signal; and
    a divider for dividing the amplified signal from said amplifying unit to output one portion of the divided signal and feed back the other portion of the divided signal through said transmission line, wherein the amplifying unit includes a variable gain amplifier and a varactor diode connected to said variable gain amplifier for providing a phase deviation to a frequency response of said variable gain amplifier, said varactor diode being controlled to set a center frequency of the filter to a predetermined value, and said variable gain amplifier compensating for variations in gain with respect to variations in the center frequency such that the filter has substantially constant gain with respect to the center frequency.

2. The monolithic tunable recursive filter of claim 1, wherein said variable gain amplifier comprises:

a first transistor having a gate connected to said combiner and a source connected to the ground;

a first biasing unit for biasing said gate of said first transistor, a second transistor having a source connected to a drain of the first transistor and a drain connected to said divider; and a second biasing unit for biasing a gate of said second transistor.

3. The monolithic tunable recursive filter of claim 2, wherein said variable gain amplifier further comprises a feedback resistor connected between said drain of said second transistor and said gate of said first transistor.

4. The monolithic tunable recursive filter of claim 2, wherein said variable gain amplifier further comprises a load resistor having one end connected to said drain of said second transistor and the other end connected to ground.

5. The monolithic tunable recursive filter of claim 2, wherein said variable gain amplifier further comprises a choke inductor having one end connected to said drain of said second transistor and the other end connected to a supply voltage.

6. The monolithic tunable recursive filter of claim 2, wherein said variable gain amplifier further comprises a capacitor having one end connected to said drain of said second transistor; and wherein the varactor diode has one end connected to the other end of said capacitor and the other end connected to ground.

7. The monolithic tunable recursive filter of claim 6, wherein said varactor diode is a metal-semiconductor field effect transistor (MESFET) of which a source and a drain are connected to each other.

8. The monolithic tunable recursive filter of claim 6, wherein said varactor diode is a metal-oxide-semiconductor field effect transistor (MOSFET) of which a source and a drain are connected to each other.

9. The monolithic tunable recursive filter of claim 2, wherein said variable gain amplifier further comprises:

means for matching an input impedance of said variable gain amplifier to an impedance of said combiner; and means for matching an output impedance of said variable gain amplifier to an impedance of said divider.

10. A monolithic tunable recursive filter comprising:

a first transmission line of a first length;

a second transmission line of a second length;

a combiner for receiving an input signal, a first feedback signal fed back through said first transmission line, and a second feedback signal fed back through said second transmission line, and combining the input signal and the first and second feedback signals to output a combined signal;

an amplifying unit for amplifying the combined signal and outputting an amplified signal; and a divider for dividing the amplified signal from said amplifying unit to output a first portion of the divided signal and feed back a second and third portion of the divided signal through said first and second transmission lines, respectively, wherein the amplifying unit includes a variable gain amplifier and a varactor diode connected to said variable gain amplifier for providing a phase deviation to a frequency response of said variable gain amplifier, said varactor diode being controlled to set a center frequency of the filter to a predetermined value and said variable gain amplifier compensating for variation in gain with respect to variation in the center frequency such that the filter has substantially constant gain with respect to the center frequency.

11. The monolithic tunable recursive filter of claim 10, wherein the first length is equal to the second length.

12. The monolithic tunable recursive filter of claim 10, wherein said variable gain amplifier comprises:

a first transistor having a gate connected to said combiner and a source connected to ground;

a first biasing unit for biasing said gate of said first transistor;

a second transistor having a source connected to a drain of the first transistor and a drain connected to said divider; and a second biasing unit for biasing a gate of said second transistor.

13. The monolithic tunable recursive filter of claim 12, wherein said variable gain amplifier further comprises a feedback resistor connected between said drain of said second transistor and said gate of said first transistor.

14. The monolithic tunable recursive filter of claim 12, wherein said variable gain amplifier further comprises a load resistor having one end connected to said drain of said second transistor and the other end connected to ground.

15. The monolithic tunable recursive filter of claim 12, wherein said variable gain amplifier further comprises a choke inductor having one end connected to said drain of said second transistor and the other end connected to a supply voltage.

16. The monolithic tunable recursive filter of claim 12, wherein said variable gain amplifier further comprises a capacitor having one end connected to said drain of said second transistor; and wherein the veracator diode has one end connected to the other end of said capacitor and the other end connected to ground.

17. The monolithic tunable recursive filter of claim 16, wherein said varactor diode is a metal-semiconductor field effect transistor (MESFET) of which a source and a drain are connected to each other.

18. The monolithic tunable recursive filter of claim 16, wherein said varactor diode is a metal-oxide-semiconductor field effect transistor (MOSFET) of which a source and a drain are connected to each other.

19. The monolithic tunable recursive filter of claim 12, wherein said variable gain amplifier further comprises:

means for matching an input impedance of said variable gain amplifier to an impedance of said combiner; and means for matching an output impedance of said variable gain amplifier to an impedance of said divider.

20. The monolithic tunable recursive filter of claim 10, wherein the first length is different from the second length.

* * * * *